(12) United States Patent
Kuan

(10) Patent No.: US 8,373,978 B2
(45) Date of Patent: Feb. 12, 2013

(54) ELECTRONIC DEVICE WITH FIXING ELEMENT

(75) Inventor: Chang-Ming Kuan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 194 days.

(21) Appl. No.: 13/074,017

(22) Filed: Mar. 29, 2011

(65) Prior Publication Data
US 2012/0019994 A1    Jan. 26, 2012

(30) Foreign Application Priority Data
Jul. 22, 2010    (TW) .................................. 99213950

(51) Int. Cl.
 G06F 1/16       (2006.01)
 H05K 7/00       (2006.01)
 F16M 13/00      (2006.01)
(52) U.S. Cl. ..................... 361/679.21; 248/422; 248/922
(58) Field of Classification Search .. 361/679.21–679.3; 248/222.52, 349.1, 422, 917–924
See application file for complete search history.

(56) References Cited

U.S. PATENT DOCUMENTS

| | | | | |
|---|---|---|---|---|
| 3,791,226 | A * | 2/1974 | Cappelle et al. | ............... 74/10.8 |
| 4,297,548 | A * | 10/1981 | Little | ......................... 200/61.08 |
| 6,354,552 | B1 * | 3/2002 | Chiu | ............................. 248/422 |
| D489,377 | S * | 5/2004 | van Kuijk | ..................... D14/451 |
| D495,713 | S * | 9/2004 | Pfister et al. | .................. D14/451 |
| D587,258 | S * | 2/2009 | Vaglica et al. | ................ D14/239 |
| 7,837,159 | B2 * | 11/2010 | Tsuo et al. | ..................... 248/131 |
| 7,984,889 | B2 * | 7/2011 | Whitley et al. | ................ 248/371 |
| 2005/0205731 | A1 * | 9/2005 | Shimizu et al. | ............. 248/176.3 |
| 2008/0210841 | A1 * | 9/2008 | Tseng | ............................ 248/422 |
| 2009/0001239 | A1 * | 1/2009 | Dong et al. | .................... 248/393 |
| 2009/0179133 | A1 * | 7/2009 | Gan et al. | ....................... 248/422 |
| 2009/0314912 | A1 * | 12/2009 | Whitley et al. | ............. 248/299.1 |
| 2011/0002110 | A1 * | 1/2011 | Skull | .............................. 361/825 |
| 2012/0002393 | A1 * | 1/2012 | Stanek et al. | .................. 361/825 |

* cited by examiner

*Primary Examiner* — Adrian S Wilson
(74) *Attorney, Agent, or Firm* — Altis Law Group, Inc.

(57) ABSTRACT

An electronic device includes an enclosure and a fixing assembly attached to the enclosure. The fixing assembly includes fixing portion rotatably attached to the enclosure, a resilient element fixed to the fixing portion and an adjusting portion non-rotatably fixed to the enclosure. The fixing portion and the enclosure cooperatively define a receiving room to receive the adjusting portion and the resilient element. The resilient element includes a first engaging portion and a second engaging portion. The adjusting portion is substantially circle-shaped and defines a plurality of positioning teeth configured on a peripheral circumference of the adjusting portion. Friction between the positioning teeth of the adjusting portion and the first and second engaging portion of the resilient element causes the first engaging portion and a second engaging portion tightly engage with the plurality of positioning teeth to non-rotatably position the enclosure at different angles relative to the fixing assembly.

14 Claims, 4 Drawing Sheets

ELECTRONIC DEVICE WITH FIXING ELEMENT

BACKGROUND

1. Technical Field

The present disclosure relates to electronic devices, and more particularly to an electronic device with a fixing element.

2. Description of Related Art

Many electronic devices, such as IP phones, or LCD TVs, are mounted on walls by use of bolts or other fasteners. Generally, these electronic devices are configured with a groove and the bolts or fasteners pass through the groove and fix the electronic devices to the walls. In this way, the electronic devices cannot rotate relative to the walls, thereby cannot accord with various requirements of a user.

Therefore, there is a room for improvement within the art.

DETAILED DESCRIPTION

Figure 1:
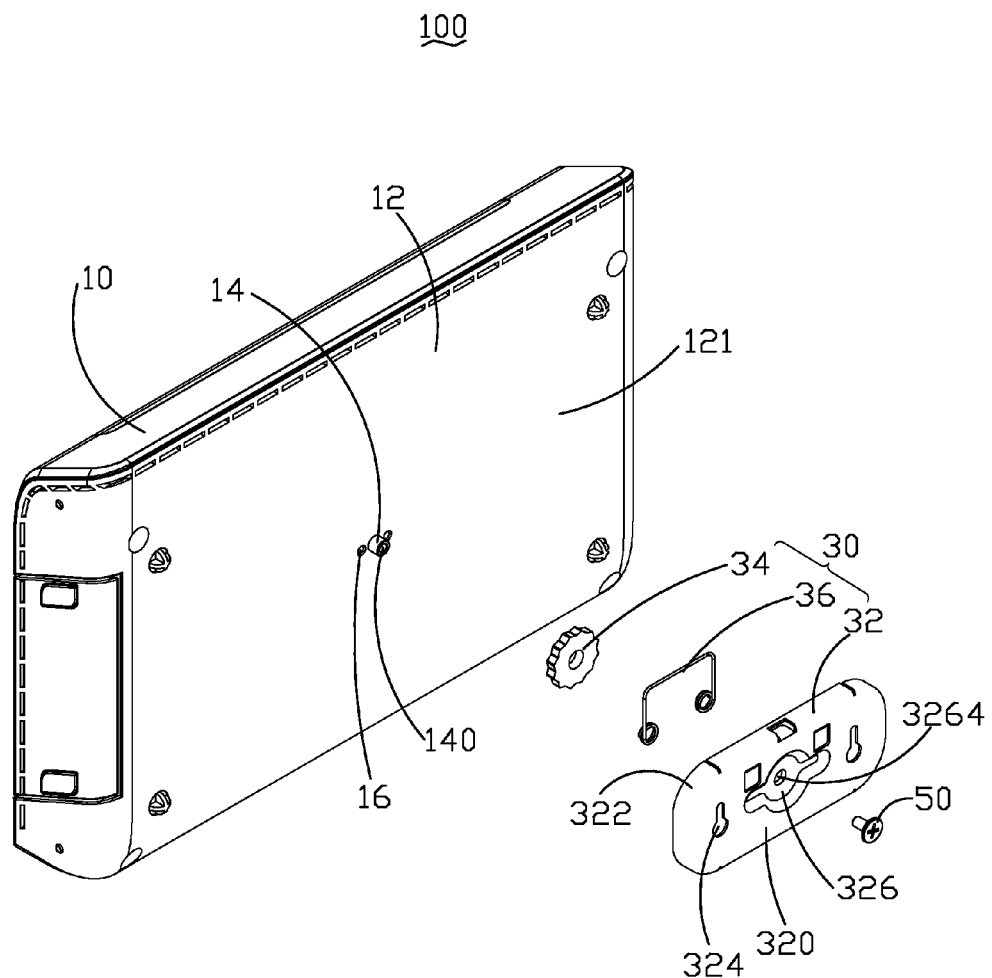
FIG. 1 is an exploded, isometric view of an electronic device of an exemplary embodiment of the disclosure.

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

Referring to FIG. 1, an exploded, isometric view of electronic device 100 of an exemplary embodiment of the present disclosure is illustrated. The electronic device 100 includes an enclosure 10 and a fixing assembly 30. The electronic device 100 may be but not limited to a phone, a router, a switch, or an LCD TV, for example.

The enclosure 10 accommodates electronic components, such as printed circuit boards and/or hard disk drives. Although the illustrated embodiment shows the enclosure 10 being substantially rectangular in shape, other configurations, shapes, or structures may be utilized. In this exemplary embodiment, the enclosure 10 includes a bottom wall 12 configured with a positioning post 14 and at least one positioning hole 16. The positioning post 14 perpendicularly protrudes from an outer surface 121 of the bottom wall 12. In this embodiment, the positioning post 14 is located at a center of the bottom wall 12, and the bottom wall 12 defines two positioning holes 16 respectively locating two opposite sides of the positioning post 14. The positioning post 14 is hollow and defines a screw hole 140.

Figure 2:
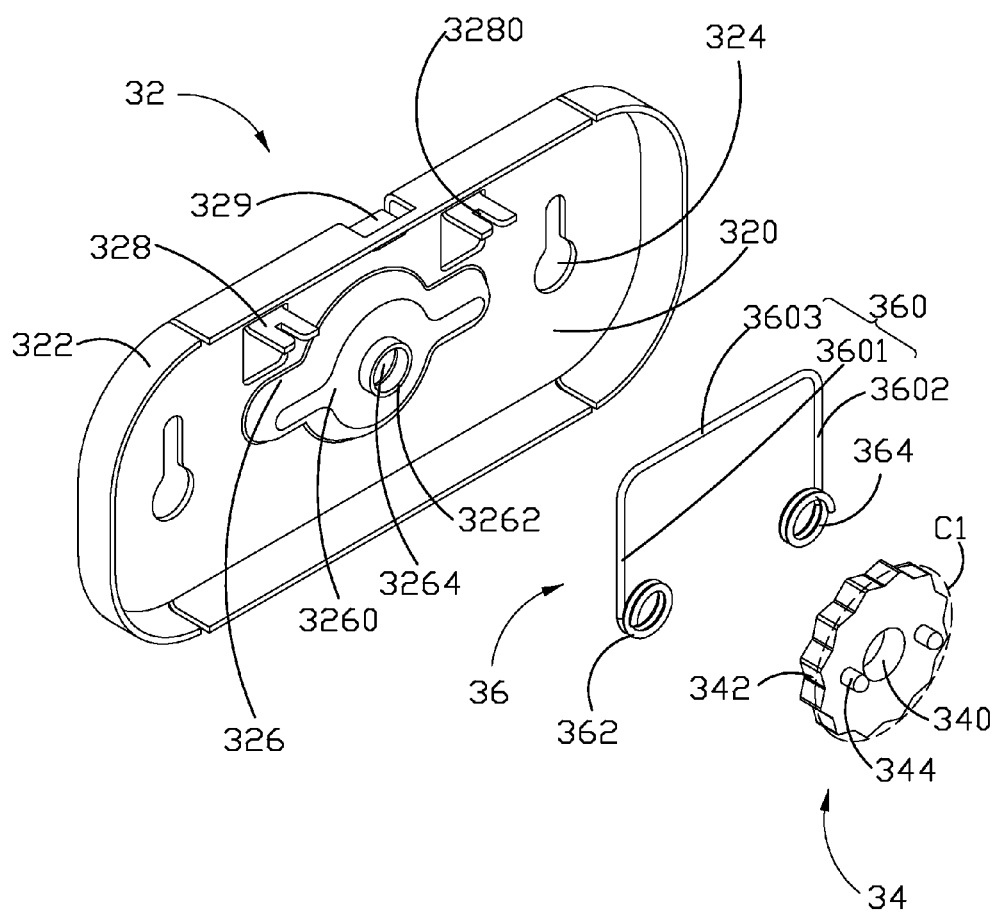
FIG. 2 is an exploded, isometric view of a fixing element of the electronic device of FIG. 1.
Figure 3:
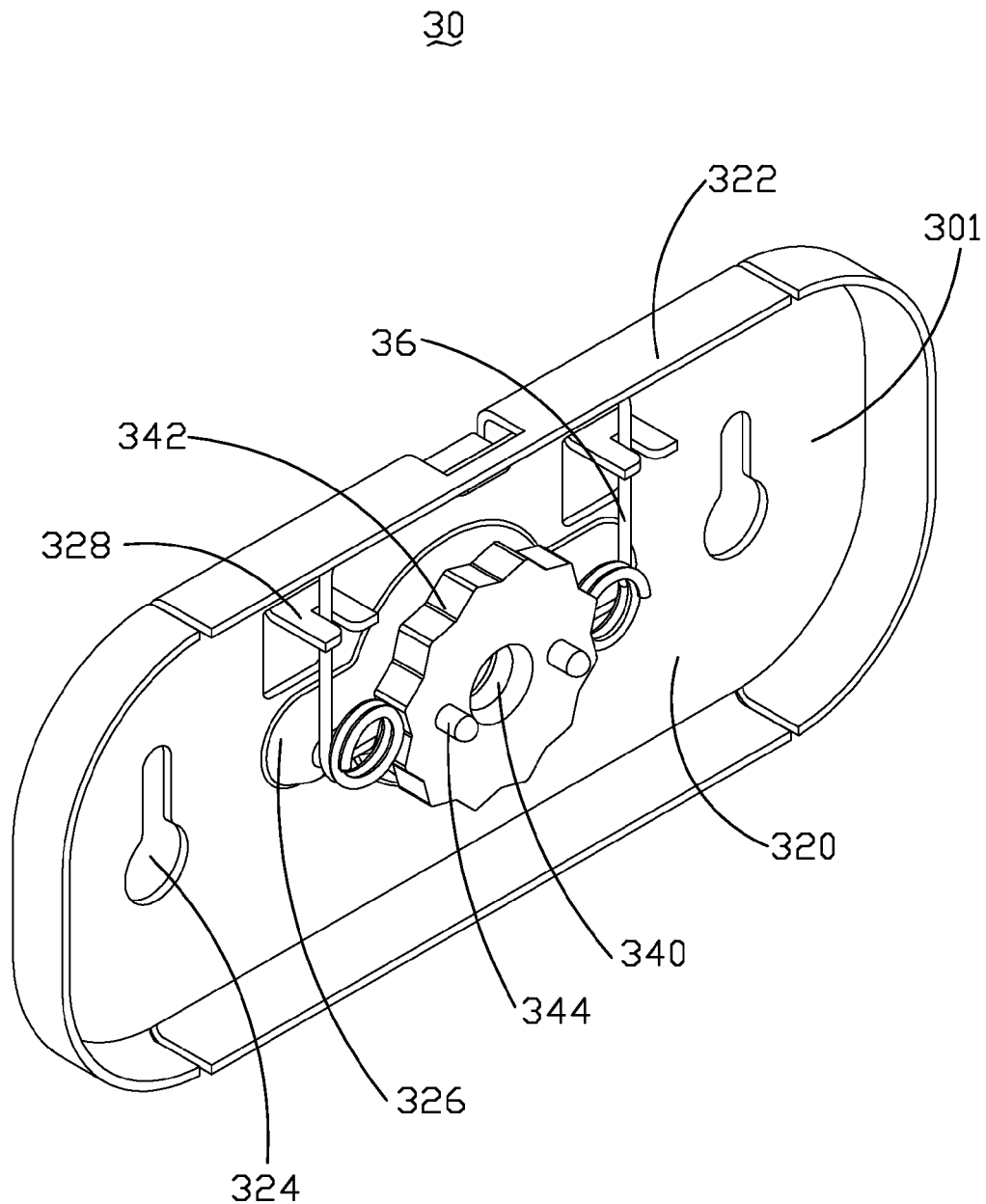
FIG. 3 is an assembled view of the fixing element of FIG. 3.

Referring to FIG. 2 and FIG. 3, the fixing assembly 30 is attached to the bottom wall 12 and used to fix the enclosure 10 onto a wall or other surfaces (not shown). The fixing assembly 30 comprises a fixing portion 32, an adjusting portion 34 and a resilient element 36. The adjusting portion 34 is non-rotatably fixed to the bottom wall 12 of the enclosure 10. The fixing portion 32 and the bottom wall of the enclosure 10 cooperatively define a receiving room 301 to receive the adjusting portion 34 and the resilient element 36.

The fixing portion 32 comprises a fixing plate 320 and a side wall 322 perpendicularly extending from an edge of the fixing plate 320. The fixing plate 320 defines two gourd-shaped holes 324. The fixing portion 32 comprises a resisting portion 326 protrudes from a substantial center of the fixing plate 320, and located between the two gourd-shaped holes 324. The resisting portion 326 and the side wall 322 protrude from the fixing plate 320 on a same side of the fixing plate 320. The resisting portion 326 comprises a resisting wall 3260 parallel with the bottom wall 12 and a limiting portion 3262 protruding from the resisting wall 3260 away from the fixing plate 320. The resisting portion 326 further defines a through hole 3264 passing through a center of the limiting portion 3262. The two gourd-shaped holes 324 are defined on two sides of the limiting portion 3262.

The fixing portion 32 further comprises a pair of clamping portions 328 and a supporting portion 329 protruding from the fixing plate 320, to secure the resilient element 36. The pair of clamping portions 328 are located two sides of the limiting portion 3262 respectively. The supporting portion 329 is located between the pair of clamping portions 328. Each of the pair of clamping portions 328 defines a positioning gap 3280 to position the resilient element 36.

The adjusting portion 34 is fixed to the bottom wall 12 and located between the enclosure 10 and fixing portion 32, in assembly. The adjusting portion 34 is substantially circular in shape, and a mounting hole 340 is defined at a center of the adjusting portion 34. At least one positioning block 344 is perpendicularly configured on one side of the adjusting portion 34, to engage with at least one of the two positioning holes 16 to prevent the adjusting portion 34 from rotating relatively to enclosure 10. A plurality of positioning teeth 342 are configured on a peripheral circumference C1 of the adjusting portion 34. In this embodiment, the adjusting portion 34 comprises two positioning blocks 344 close to the mounting hole 340 and respectively received by the two positioning holes 16.

The resilient element 36 comprises a base portion 360 fixed to the clamping portions 328 and the supporting portion 329 of the fixing portion 32, and two engaging portions, as a first engaging portion 362 and a second engaging portion 364, configured on two ends of the base portion 360 respectively. The first engaging portion 362 and the second engaging portion 364 are used to engage with one pair of the plurality of positioning teeth 342. In assembly, the first engaging portion 362 and the second engaging portion 364 are respectively located two opposite sides of the adjusting portion 34 and tightly engage with the positioning teeth 342 of the adjusting portion 34, to prevent the adjusting portion 34 from rotating relative to the fixing portion 32. In this way, the enclosure 10 is non-rotatably positioned to the fixing assembly 30. In this embodiment, the first engaging portion 362 and the second engaging portion 364 are ring-shaped. The base portion 360 comprises a connecting pole 3603, and a pair of arms 3601, 3602 perpendicularly extending from two ends of the connecting pole 3603. In assembly, the pair of arms 3601, 3602 of the base portion 360 are wedged in the positioning gaps 3280 of the clamping portions 328, and the connecting pole 3603 is supported on the supporting portion 329, thereby preventing the resilient element 36 from moving relative to the fixing portion 32.

Due to friction between the positioning teeth 342 of the adjusting portion 34 and the first and second engaging portion 362, 364 of the resilient element 36, the enclosure 10 can be positioned at different angles relative to the fixing assembly 30.

Figure 4:
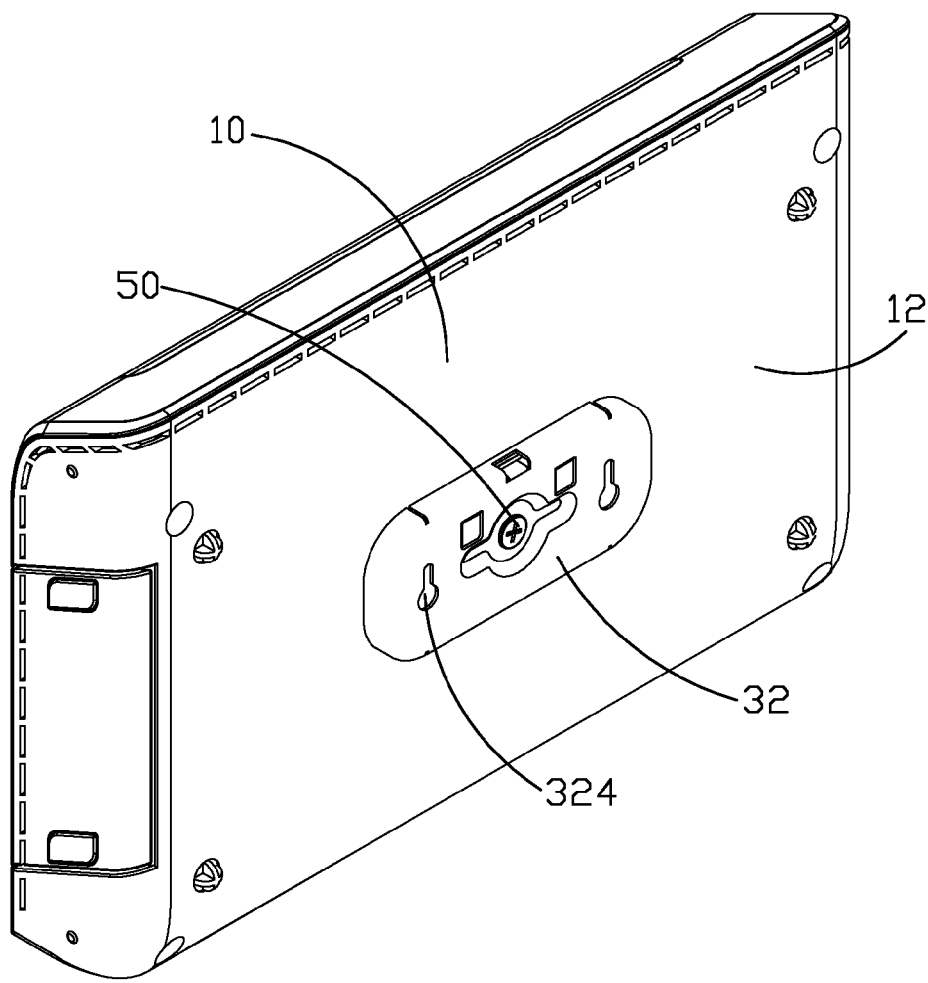
FIG. 4 is an assembled view of the electronic device of FIG. 1.

Referring to FIG. 4, in assembly, the adjusting portion 34 is mounted to the fixing portion 32 via the limiting portion 3262 received in the mounting hole 340, with relatively rotatable movement between the adjusting portion 34 and the fixing portion 32. The resilient element 36 is fixed to the fixing portion 32 with the first engaging portion 362 and the second engaging portion 364 respectively tightly engaging two positioning teeth 342, that is, the adjusting portion 34 is non-rotatably positioned to the fixing portion 32 due to tight clamping of the resilient element 36 to the adjusting portion 34. The fixing portion 32 and the adjusting portion 34 are mounted to the enclosure 10 via the positioning post 14 received in the mounting hole 340, the two positioning blocks 344 received in the positioning holes 16 and a screw 50 passing through the through hole 3264 of the fixing portion 32 and screwed into the screw hole 140 of the positioning post 14. Therefore, the adjusting portion 34 is un-rotatably fixed to the enclosure 10, and the fixing portion 32 is rotatably attached to the enclosure 10.

In assembly, the adjusting portion 34 is snugly mounted between the fixing portion 32 and the enclosure 10, preventing rocking of the enclosure 10 relative to the fixing assembly 30.

When the enclosure 10 is rotated relative to the fixing assembly 30 under force, the adjusting portion 34 rotate between the first engaging portion 362 and the second engaging portion 364 to make the first engaging portion 362 and the second engaging portion 364 engage two different positioning teeth 342 due to flexibility of the resilient element 36. That is, when the adjusting portion 34 is rotated relatively to the engaging portions 362, 364, the resilient element 36 distorts and recovers, and the engaging portions 362, 364 engage from one to another pair of positioning teeth 342. Therefore, the enclosure 10 can be positioned at different angles relative to the fixing assembly 30, according to various requirements of a user.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising an enclosure and a fixing assembly attached to the enclosure, the fixing assembly comprising:
    an adjusting portion, non-rotatably fixed to the enclosure and substantially circular in shape, and defining a plurality of positioning teeth configured on a peripheral circumference of the adjusting portion;
    a fixing portion, rotatably attached to the enclosure; and
    a resilient element, fixed to the fixing portion and comprising a first engaging portion and a second engaging portion respectively located on two opposite sides of the adjusting portion;
    the fixing portion and the enclosure cooperatively defining a receiving room to receive the adjusting portion and the resilient element;
    wherein friction between the positioning teeth of the adjusting portion and the first and second engaging portion of the resilient element causes the first engaging portion and a second engaging portion tightly engage with the plurality of positioning teeth to non-rotatably position the enclosure at different angles relative to the fixing assembly.

2. The electronic device as recited in claim 1, wherein the enclosure comprises a bottom wall configured with a positioning post, which is hollow, defining a screw hole and perpendicularly protruding from an outer surface of the bottom wall, the adjusting portion defines a mounting hole at a center of the adjusting portion, the fixing portion defines a through hole, the fixing portion is mounted to the enclosure via the positioning post received in the mounting hole and a screw passing through the through hole of the fixing portion and screwed into the screw hole of the positioning post.

3. The electronic device as recited in claim 2, wherein the bottom wall defines at least one positioning hole, the adjusting portion comprises at least one positioning block to engage with the at least one positioning hole to prevent the adjusting portion from rotating relative to the enclosure.

4. The electronic device as recited in claim 1, wherein the fixing portion comprises a pair of clamping portions and a supporting portion used to secure the resilient element.

5. The electronic device as recited in claim 4, wherein the resilient element comprises a base portion, the first engaging portion and the second engaging portion are respectively configured on two ends of the base portion, the base portion comprises a connecting pole and a pair of arms perpendicularly extending from two ends of the connecting pole, each of the clamping portions defines a positioning gap, the pair of arms of the base portion are wedged in the positioning gaps, the connecting pole is supported on the supporting portion.

6. The electronic device as recited in claim 5, wherein the first engaging portion and the second engaging portion are ring-shaped.

7. The electronic device as recited in claim 1, wherein the adjusting portion is snugly mounted between the fixing portion and the enclosure, preventing rocking of the enclosure relative to the fixing assembly.

8. An electronic device, comprising an enclosure and a fixing assembly attached to the enclosure, the fixing assembly comprising:
    an adjusting portion non-rotatably fixed to a substantial center of the enclosure and defining a plurality of pairs of positioning teeth on a peripheral edge of the adjusting portion;
    a fixing portion comprising a limiting portion received in a mounting hole in a center of the adjusting portion and rotatably attached to the enclosure, wherein the fixing portion defines two gourd-shaped holes on two sides of the limiting portion; and
    a resilient element, fixed to the fixing portion and comprising two engaging portions engaged with one pair of positioning teeth respectively on two opposite sides of the adjusting portion;
    wherein under force, the adjusting portion is rotated relatively to the engaging portions, the resilient element distorts and recovers and the engaging portions engage from said one to another pair of positioning teeth, so that the enclosure is positioned at different angles relative to the fixing assembly.

9. The electronic device as recited in claim 8, wherein the enclosure comprises a bottom wall configured with a positioning post, which is hollow, defining a screw hole and perpendicularly protruding from an outer surface of the bottom wall, the fixing portion defines a through hole, the fixing portion is mounted to the enclosure via the positioning post received in the mounting hole and a screw passing through the through hole of the fixing portion and screwed into the screw hole of the positioning post.

10. The electronic device as recited in claim 9, wherein the bottom wall defines at least one positioning hole, the adjusting portion comprises at least one positioning block to engage with the at least one positioning hole to prevent the adjusting portion from rotating relative to the enclosure.

11. The electronic device as recited in claim 8, wherein the fixing portion comprises a pair of clamping portions and a supporting portion used to secure the resilient element.

12. The electronic device as recited in claim 11, wherein the resilient element comprises a base portion, the engaging portions are respectively configured on two ends of the base portion, the base portion comprises a connecting pole and a pair of arms perpendicularly extending from two ends of the connecting pole, each of the clamping portions defines a positioning gap, the pair of arms of the base portion are wedged in the positioning gaps, the connecting pole is supported on the supporting portion.

13. The electronic device as recited in claim 12, wherein the engaging portions are ring-shaped.

14. The electronic device as recited in claim 8, wherein the adjusting portion is snugly mounted between the fixing portion and the enclosure, preventing rocking of the enclosure relative to the fixing assembly.

* * * * *